(12) United States Patent
Li et al.

(10) Patent No.: US 6,930,048 B1
(45) Date of Patent: Aug. 16, 2005

(54) ETCHING A METAL HARD MASK FOR AN INTEGRATED CIRCUIT STRUCTURE

(75) Inventors: SiYi Li, Fremont, CA (US); S.M. Rega Sadjadi, Saratoga, CA (US); Sean S. Kang, Fremont, CA (US); Tri Le, Milpitas, CA (US); Bi-Ming Yen, Fremont, CA (US); Scott Briggs, Menlo Park, CA (US)

(73) Assignee: Lam Research Corporation, Fremont, CA (US)

( * ) Notice: Subject to any disclaimer, the term of this patent is extended or adjusted under 35 U.S.C. 154(b) by 96 days.

(21) Appl. No.: 10/246,844

(22) Filed: Sep. 18, 2002

(51) Int. Cl.$^7$ .............................. H01L 21/302
(52) U.S. Cl. ............... 438/710; 438/717; 438/720; 438/723; 438/725
(58) Field of Search .................... 438/710, 717, 438/720, 723, 725

(56) References Cited

U.S. PATENT DOCUMENTS

| | | | | |
|---|---|---|---|---|
| 6,121,150 A | * | 9/2000 | Avanzino et al. | 438/692 |
| 6,194,323 B1 | * | 2/2001 | Downey et al. | 438/717 |
| 6,734,096 B2 | * | 5/2004 | Dalton et al. | 438/624 |

* cited by examiner

Primary Examiner—Nadine G. Norton
Assistant Examiner—Binh X. Tran
(74) Attorney, Agent, or Firm—IP Strategy Group, P.C.

(57) ABSTRACT

The invention is a method of etching an integrated circuit (IC) structure that includes a metal hard mask layer. The etching of the metal hard mask layer is performed by first feeding a gas mixture comprising a fluorine containing gas and oxygen ($O_2$) gas to a reactor. The method then proceeds to generate a plasma that etches the metal hard mask layer. The method can be applied to either performing a via etch or a trench etch. Additionally, the invention teaches the removal of a photoresist layer without affecting the metal hard mask layer.

32 Claims, 8 Drawing Sheets

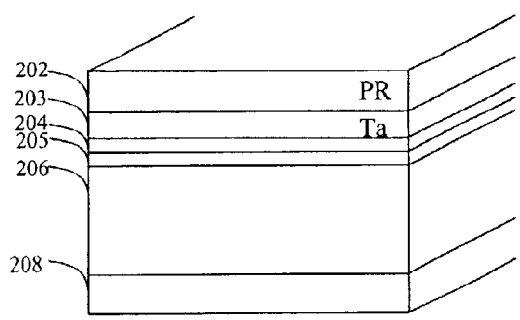
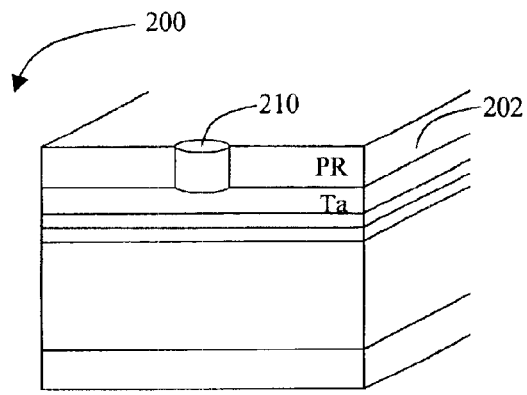
FIG. 3A  FIG. 3B
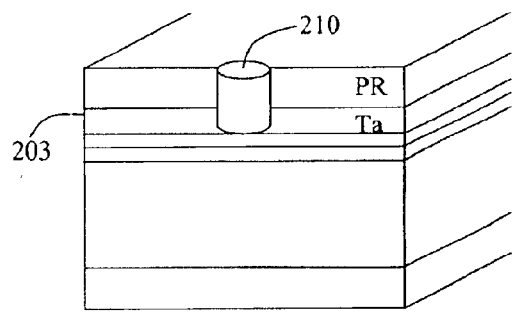
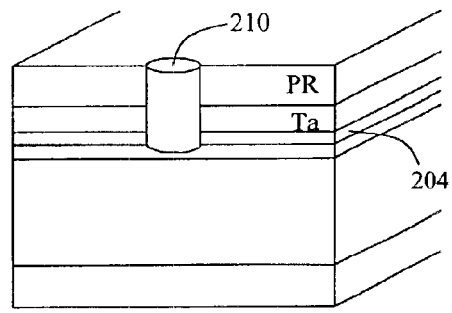
FIG. 3C  FIG. 3D
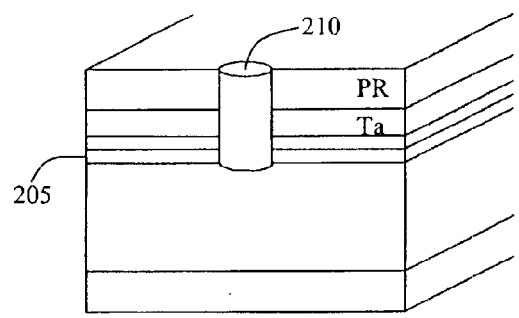
FIG. 3E

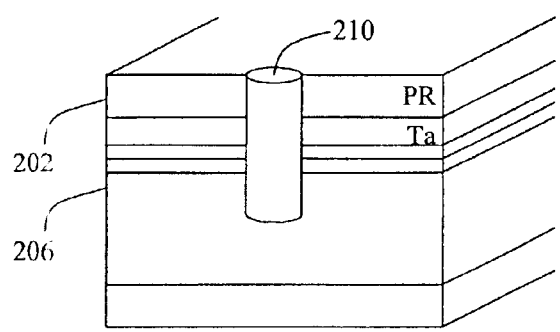
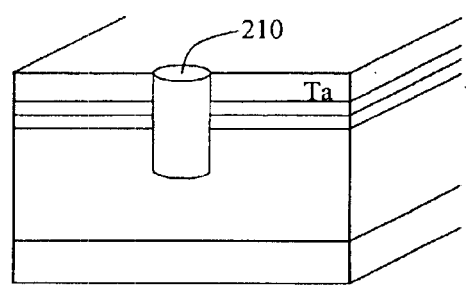
FIG. 3F                FIG. 3G
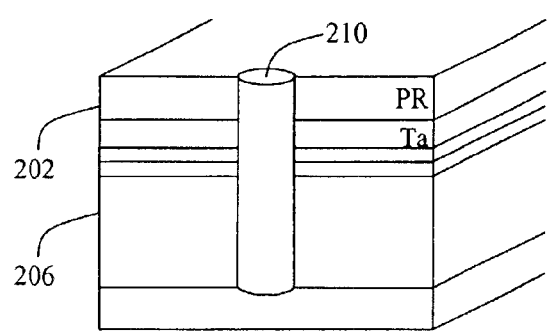
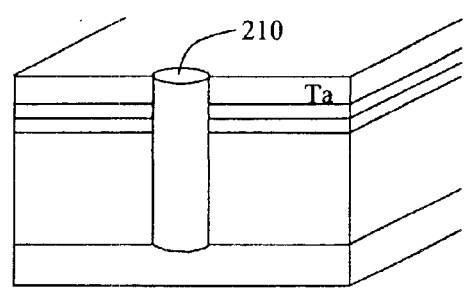
FIG. 3H                FIG. 3I

ETCHING A METAL HARD MASK FOR AN INTEGRATED CIRCUIT STRUCTURE

BACKGROUND OF THE INVENTION

1. Field of Invention

The present invention relates to the etching of an integrated circuit structure. More particularly, the present invention describes etching an integrated circuit having a metal hard mask layer.

2. Description of Related Art

Metals such as Tantalum (Ta) and Titanium (Ti) and metallic compounds such as Tantalum Nitride (TaN) and Titanium Nitride (TiN) have been widely used in integrated circuit fabrication. More particularly, these metals and metallic compounds have been used as antireflective coatings or barrier layers.

As IC manufacturing technology enters into 0.10 µm and beyond technology nodes, metals and metallic compounds are being investigated as a hard mask layer for a dielectric layer such as porous organo-silica-glass (pOSG).

There are many well-known approaches to etching a metal hard mask. One well known method uses a high-density plasma reactor in conjunction with a chlorine-containing plasma. This method requires using two reactors for an IC structure having a metal hard mask layer and dielectric layer. For the metal hard mask layer a high-density plasma reactor is used and for the dielectric a medium-density plasma reactor is used.

It would therefore be beneficial to perform the metal hard mask etching in the same chamber that is used to etch the dielectric layer of the IC structure.

An additional benefit associated with performing the metal hard mask etching and dielectric etching in the same reactor chamber is that the throughput is improved due to process simplification.

However, the chlorine-containing plasma that is typically used to etch the metal hard mask layer cannot be used in a medium-density tool used to etch the dielectric layer.

Therefore, it would be beneficial to provide a gas mixture that can perform metal hard mask etching in medium-density tool.

Additionally it would be beneficial to provide a method to overcome the difficulty associated with removing the photoresist after metal hard mask etching.

SUMMARY OF THE INVENTION

The invention is a method of etching an integrated circuit (IC) structure that includes a metal hard mask layer. The etching of the metal hard mask layer is performed by first feeding a gas mixture comprising a fluorine containing gas and oxygen ($O_2$) gas to a reactor. The method then proceeds to generate a plasma that etches the metal hard mask layer. The method can be applied to either performing a via etch or a trench etch.

The metal hard mask layer includes metals or metallic compounds. The metallic compounds include Tantalum Nitride. Other metallic compounds containing Tantalum can also be employed. The fluorine containing gas comprises either $CF_4$ or $CHF_3$ or $NF_3$ or any combination thereof. Typically, the plasma that is used during the etching process is a medium density plasma generated by a medium density tool.

Additionally, a method for etching a photoresist without affecting the metal hard mask layer is described. The method of etching the photoresist can be applied to the performance of a via etch and a trench etch in the integrated circuit (IC) structure.

BRIEF DESCRIPTION OF THE DRAWINGS

Preferred embodiments of the present invention are shown in the accompanying drawings wherein:

FIG. 3A through FIG. 3I shows an isometric view of a via being etched according to the method of FIG. 2.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

The present invention is related to the etching of a metal hard mask layer. It shall be appreciated by those of ordinary skill in the art that the method can be applied to the etching of "0.10 µm and beyond" features sizes including 0.07 µm feature sizes and any other feature size which is less than 0.10 µm. This description teaches a method for metal hard mask etching and a method for removing a photoresist layer. Finally, the resulting interconnect structure having a via opening and a trench opening is also described.

Figure 1:
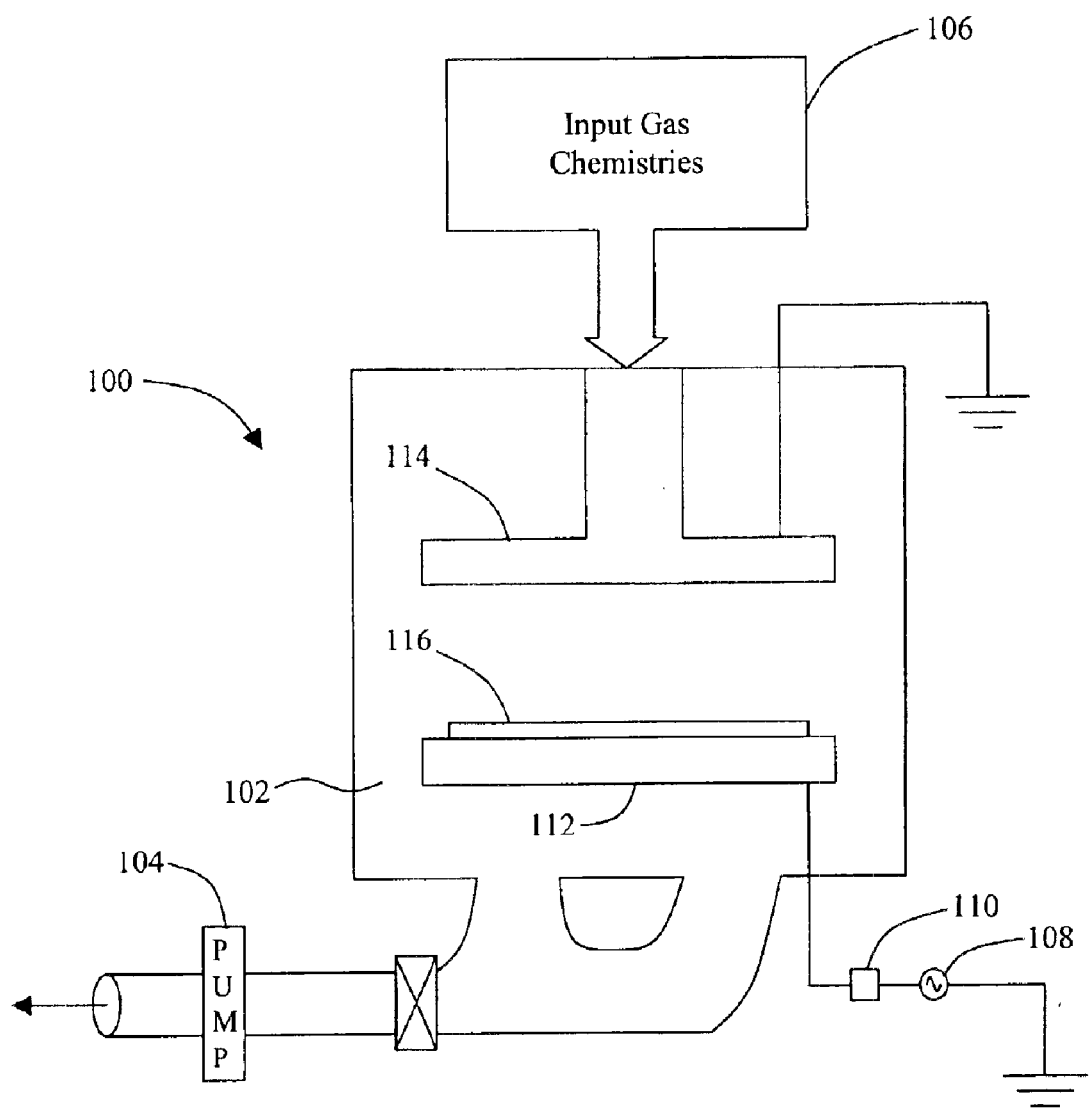
FIG. 1 shows a schematic representation of a medium density parallel plate plasma reactor which can be used to carry out the process of the invention.

Referring to FIG. 1 there is shown an illustrative device for performing the metal hard mask etching and the removal of the photoresist. The illustrative system of FIG. 1 permits performing both the hard mask etching, dielectric etching and removing the photoresist layer. The illustrative device is a parallel plate plasma reactor such as reactor 100. The reactor 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched with plasma generated by energizing the etch gasses into a plasma state. Other capacitively coupled reactors can also be used such as reactors wherein RF power is supplied to both electrodes such as the dual frequency plasma etch reactor described in commonly owned U.S. Pat. No. 6,090,304, the disclosure of which is hereby incorporated by reference.

Alternatively, the plasma can be produced in various other types of plasma reactors referred to as inductively coupled plasma reactor, an electron-cyclotron resonance (ECR) plasma reactor, a helicon plasma reactor, or the like. Such plasma reactors typically have energy sources which use RF energy, microwave energy, magnetic fields, etc. to produce a medium to high density plasma. For instance, a high density plasma could be produced in a transformer coupled plasma (TCP™) etch reactor available from Lam Research Corporation which is also called an inductively coupled plasma reactor.

Figure 2:
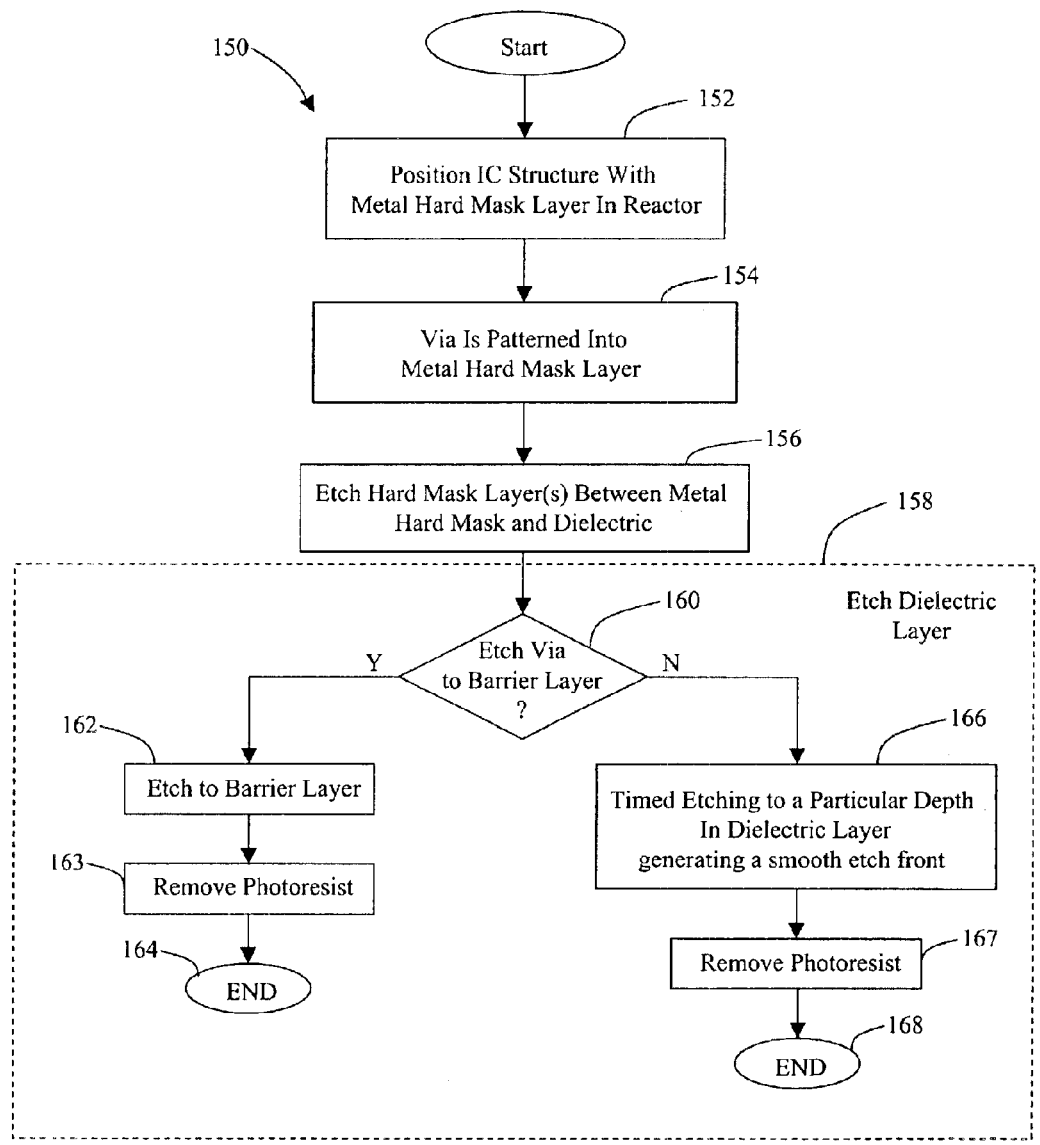
FIG. 2 shows a flowchart of a method for etching a via in an IC structure including a metal hard mask layer and a photoresist layer.
Figure 4:
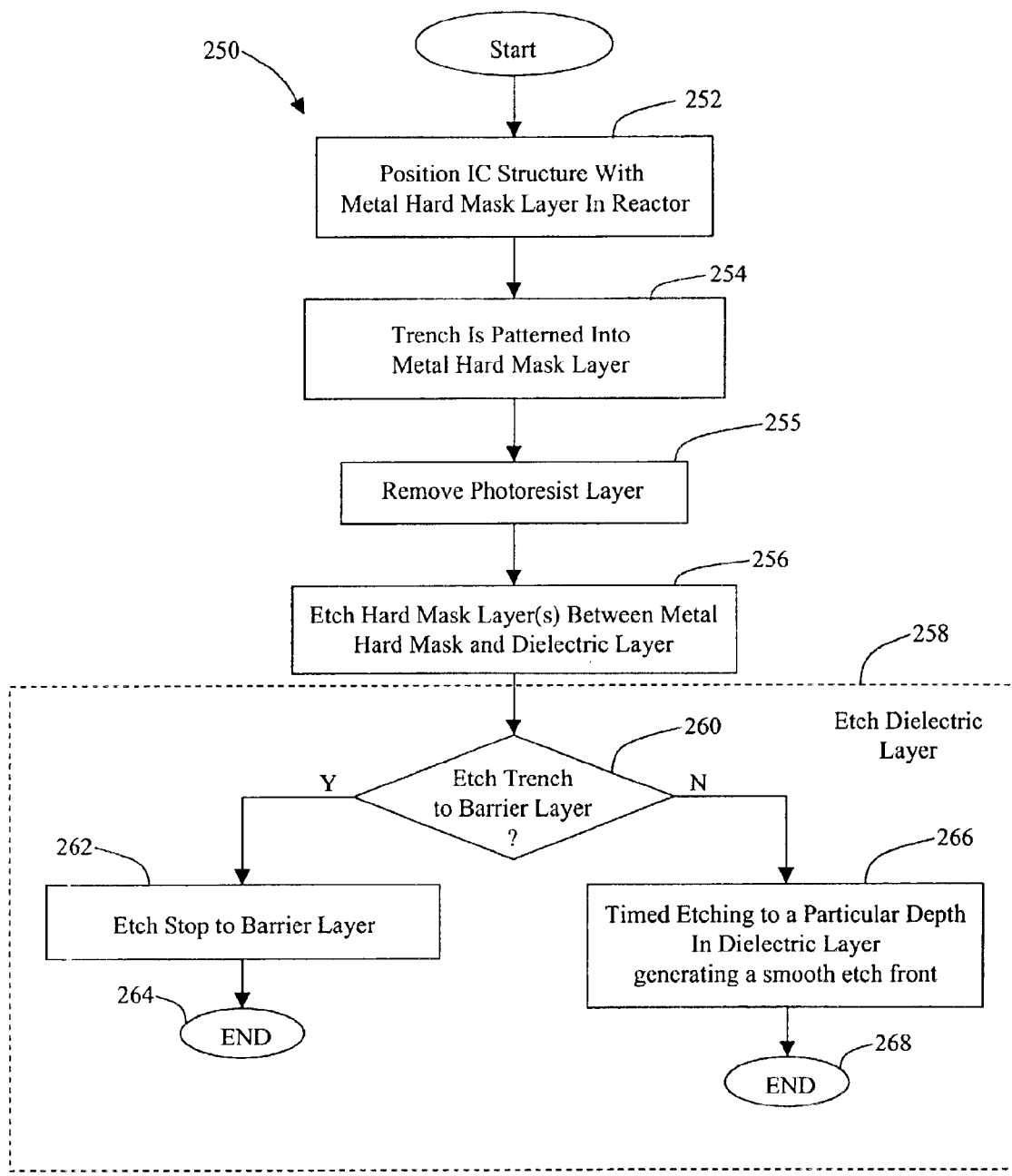
FIG. 4 shows a flowchart of a method for etching a trench in an IC structure including a metal hard mask layer and a photoresist layer.

Referring to FIG. 2 and FIG. 4 there is shown a method for etching a via and a trench, respectively. Each of these methods is applied to an IC structure having a metal hard mask layer and a photoresist layer. By way of example and not of limitation, the methods of the invention are applied to an IC structure having a photoresist or "resist" layer, a metal hard mask layer, a first intermediate hard mask layer, a second intermediate hard mask layer, a dielectric layer, and a barrier layer.

The metal hard mask layer comprises a metal or a metallic compound. The metallic compound includes Tantalum Nitride (TaN). Additionally, other metallic compounds that include Tantalum can also be used as the metal hard mask layer.

In the illustrative example there is a first intermediate hard mask layer adjacent the metal hard mask layer. The first intermediate hard mask layer can comprise a silicon containing compound such as either Silicon Nitride (SiN) or Silicon Oxide (SiO). The second intermediate hard mask layer can also include a silicon containing compound such as Silicon Carbide (SiC). In the illustrative example, one of the purposes of the intermediate hard mask layers is to provide adhesion between the metal hard mask layer and the dielectric layer.

The other layers in the illustrative IC structure include the dielectric layer and the barrier layer. By way of example only, the dielectric layer is a porous low-k dielectric layer that is a hybrid organic/inorganic silicate film having a porosity in which the void space is greater than 30%. An illustrative example of such a hybrid silicate film is a porous organo-silica-glass (pOSG) film. The barrier layer material for the illustrative example can be composed of a silicon containing material such as Silicon Carbide (SiC) or Silicon Nitride (SiN).

Referring back to FIG. 2 there is shown a flowchart describing the method for performing a via etch in a metal hard mask layer. The method is initiated at process block 152 in which the IC structure having a metal hard mask layer is positioned in reactor such as reactor 100. The method then proceeds to process step 154 in which a via is patterned into the metal hard mask layer. The generation of a via patterned hardmask layer presumes the step of completing the photolithography on the photoresist or "resist" layer. As is well known in the art, photolithography uses a light sensitive photoresist that is baked and exposed to a controlled light source. The light passes through a reticle that communicates the desired pattern.

At process block 154 the first metal hard mask layer is etched. During this step, the patterned resist layer is not attacked significantly by the etchant gas mixture. In one illustrative embodiment, the metal hard mask layer comprises TaN. During the dry etching process conducted in reactor 100, the TaN hard mask layer is removed by generating a volatile Tantalum by-product such as tantalum oxide ($Ta_2O_5$) or tantalum fluoride ($TaF_5$) or a combination thereof. The volatile Tantalum by-product reduces any potential micromasking of the photoresist layer.

The etchant gas mixture which generates the volatile Tantalum by-product(s) includes either oxygen ($O_2$) gas, or fluorine ($F_2$) gas, or a fluorine-contained gas, such as $NF_3$ or $CF_4$ or $CHF_3$, or a combination thereof. It shall be appreciated by those skilled in the art that other halogen gases such as chlorine ($Cl_2$), bromine ($I_2$), and iodine ($I_2$) can also be used to generate volatile tantalum halides. Typically, the fluorocarbon gas has a chemical composition of $C_xF_y$, or $C_xF_yH_z$, wherein x,y and z represent integers. Further still, the etchant gas mixture may include an inert gas as a diluent. The inert gas includes the nobles gases Ar, He, Ne, Kr, and Xe.

For the illustrative TaN metal hard mask embodiment, an illustrative gas mixture is shown in Table 1. The etching process for each of the illustrative gas mixtures described hereinafter is performed within a reactor 100 adapted to receive a 200 mm wafer. As shown in Table 1 the gas mixture applied to the hard mask layer includes $O_2$, $CF_4$, and Ar supplied at a flow rate of 5 sscm, 60 sscm, and 500 sccm, respectively. The chamber pressure is 200 mTorr and the RF power is 1200 Watts during the hard mask etch process step.

TABLE 1

Illustrative Gas Mixture For TaN Hard Mask Etch

| Etchant Gas Component | Supply Rate (sccm) | Chamber Pressure (mTorr) | RF Power (W) | TaN Etch Rate (Å/min) | Resist Etch Rate (Å/min) |
|---|---|---|---|---|---|
| $O_2$ | 5 | 200 | 1200 | 630 | 1900 |
| $CF_4$ | 60 | | | | |
| Ar | 500 | | | | |

The resulting etch rate for the TaN hard mask layer according to the illustrative operating parameters is 630 Å/min. The resist etch rate during the etching of the photoresist is 1900 Å/min. The etch rate data in Table 1 is associated with a bottom electrode temperature of 20° C. wherein the wafer sits on the bottom electrode. The etch rate of TaN will increases substantially with the electrode temperature. The temperature range may be as high as 60° C. At this elevated temperature etch by-products can more easily desorb from the wafer, thereby enhancing the etch rate and producing little or no micromask. As a result of having little or no micromask, the photoresist is more easily removed using conventional dry etching methods.

The method then proceeds to process block 156 where the intermediate hard mask layers are etched. In the illustrative embodiment the first intermediate hard mask layer is composed of Silicon Nitride (SiN) and the second intermediate hard mask layer is composed of Silicon Carbide (SiC). In the illustrative embodiment, the etching of the intermediate hard mask layers is performed in the same reactor 100.

In the illustrative embodiment the first intermediate hard mask layer is composed of either SiN and is etched with a fluorocarbon mixture that includes oxygen ($O_2$). One illustrative gas mixture for etching the second hard mask layer includes $CF_4$ or $CHF_3$ and oxygen ($O_2$) gas. Another alternative illustrative gas mixture includes $NF_3$, $CH_3F$, and oxygen ($O_2$) gas.

In the illustrative embodiment, the second intermediate hard mask layer is composed of SiC is etched with a fluorocarbon mixture that does NOT include oxygen. An illustrative gas mixture for etching the second intermediate hard mask layer includes $CF_4$ and nitrogen ($N_2$) gas, or $CHF_3$ and nitrogen ($N_2$) gas, or any combination thereof.

The purpose of performing this etching sequence is to remove all oxygen ($O_2$) gas in the reactor 100 prior to the etching the illustrative porous low-dielectric layer. An illustrative gas mixture for the etching of the second intermediate hard mask layer includes 200 sccm of nitrogen ($N_2$) gas, 10 sccm of $CF_4$, 10 sccm of $CHF_3$ gas, and 200 sccm of Argon gas. The illustrative RF power is 800 Watts, and the resulting SiC (second intermediate hard mask layer) etch rate is 900 Å/min and the SiN (first intermediate hard mask layer) is 500 Å/min.

After each hard mask layers have been etched, the method proceeds to the etching of the dielectric material. The boundary condition 158 defines the process steps for the etching of the porous low-k dielectric layer. At decision diamond 160 the decision is made regarding the depth of etching into the porous low-k dielectric layer. More particularly, the decision must be made whether to perform a partial etch into the porous low-k dielectric layer or whether to etch through the porous low-k dielectric layer to the barrier layer.

If the decision at diamond 160 is to etch the porous low-k dielectric layer all the way through to the barrier layer, then the method proceeds to process block 162. At process block 162 the dielectric is etched to the barrier layer and then the photoresist is removed as described in process block 164. If the decision is made to perform a partial etch in the porous low-k dielectric layer, then the method proceeds to process block 166. At process block 166 the time interval for performing the partial etch determines the depth of the partial etch. In an illustrative embodiment for the etching of the dielectric layer, the gas mixture does not include oxygen gas or a halide gas. It shall be appreciated by those of ordinary skill in the art having the benefit of this disclosure that during the etching of the dielectric layer it is critical to minimize the etching of the hard mask layer.

After the porous low-k dielectric is either etched to the barrier layer or partially etched, the method proceeds to removing the photoresist as described by process block 164 or process block 167. The prior art teaches photoresist removal using an oxidizing agent such as oxygen ($O_2$) or a halide gas. However, the use of such oxidizing agents would result in the removal of the metal hard mask layer, therefore an etchant gas mixture that does not use oxygen ($O_2$) gas or a halide gas and is selective to the photoresist layer is needed.

One illustrative gas mixtures for photoresist removal includes a highly fluorinated fluorocarbon gas such as $CF_4$ or $CHF_3$. The highly fluorinated fluorocarbon gas is used to remove any residue or micromask that may have been deposited on the photoresist layer during the etching of the metal hard mask layer.

Another illustrative gas mixture for removing the photoresist layer is provided in Table 2 below. As shown in Table 2 the illustrative gas mixture includes nitrogen ($N_2$), a fluorocarbon gas such as $CF_4$, nitrogen trifluoride ($NF_3$), and hydrogen ($H_2$) gas supplied at flow rates of 600 sccm, 15 sccm, 15 sccm, and 500 sccm, respectively. The chamber pressure is 280 mTorr and the RF power is 600 Watts during the process step 156 of etching the first photoresist layer.

TABLE 2

Illustrative Gas Mixture For Etching Photoresist

| Etchant Gas Component | Supply Rate (sccm) | Chamber Pressure (mTorr) | RF Power (W) | TaN Etch Rate (Å/min) | Resist Etch Rate (Å/min) |
|---|---|---|---|---|---|
| $N_2$ | 600 | 280 | 600 | 0 | 4050 |
| $CF_4$ | 15 | | | | |
| $NF_3$ | 15 | | | | |
| $H_2$ | 500 | | | | |

According to the operating parameters identified, the resulting etch rate for the photoresist is 4,050 Å/min. There is no identifiable etching of the TaN hard mask layer during the etching of the photoresist layer. According to the illustrative embodiment, the hard mask layers and the photoresist can be etched in the same reactor 100, thereby expediting wafer processing.

It shall be appreciated by those skilled in the art that the optimal flow rates and ratios for the illustrative gas mixture of Table 1 and Table 2 may change depending on the type of plasma etch chamber, the substrate size, and other such variables that are well know to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation for the scope of the invention.

Referring to FIG. 3A through FIG. 3I there is shown an isometric view of a via being etched according to the method described above. It shall be appreciated by those skilled in the art that the illustrative via is filled with either aluminum or copper interconnects or any such conductive material. In the illustrative embodiment, the IC structure includes a photoresist layer 202, a first TaN hard mask layer 203 having a thickness of approximately 15 to 50 nm, a first intermediate hard mask layer 204 of SiN, a second intermediate hard mask layer 205 of SiC, a porous low-k dielectric layer 206 having a thickness of approximately 200 to 1000 nm; and a barrier layer 208 having a thickness of around 45 to 70 nm.

Referring to FIG. 3B, there is shown a via 210 etched into the photoresist layer 202. The illustrative via has an internal diameter of less than 0.12 µm for a CD of 0.10 µm, and an internal diameter of less than 0.09 µm for a CD of 0.07 µm. After the via portion of the photoresist has been etched, the method proceeds to the etching of the TaN hard mask layer 203 as shown in FIG. 3C. As described in process block 154, during the etching of the TaN hard mask layer 203 a volatile metal by-product is generated. As previously described, the etchant gas includes oxygen ($O_2$) and a fluorocarbon and possibly a diluent gas such as Argon.

Referring to FIG. 3D, there is shown an integrated circuit structure after etching the first intermediate hard mask layer 204. In FIG. 3E there is shown the illustrative integrated circuit structure after etching the second intermediate hard mask layer 205.

Referring to FIG. 3F, there is shown the integrated circuit structure after the partial etching of the via 210 into the dielectric layer 206. The partial etching is performed as described above in process step 166. The photoresist layer is then etched according to the process block 168 and results in the IC structure shown in FIG. 3G.

Alternatively, the via may be etched all the way through the dielectric material 206 to the barrier layer 208 as shown in FIG. 3H. The via etch is performed as described in process step 162 described above. The photoresist 202 is then etched according to process block 164 and the resulting IC structure is shown in FIG. 3I.

Referring to FIG. 4 there is shown a flowchart of a method for etching a trench for the illustrative the IC structure described in FIG. 3. The trench process described in FIG. 4 can be applied by itself or in conjunction with the via process described in FIG. 2. By way of example and not of limitation, in a via-first dual damascene structure the via would be etched first and then the trench would be etched according to the method described below.

The trench etch method of FIG. 4 is initiated at process block 252 in which the IC structure having a metal hard mask layer is positioned in a reactor such as reactor 100. The method then proceeds to process step 254 in which a trench is patterned into the metal hard mask layer. The generation of a trench on the metal hardmask layer presumes the step of completing the photolithography on the photoresist or "resist" layer as described above.

During process block 254, the metal hard mask layer is etched. In the illustrative embodiment, the first metal hard mask layer is composed of TaN. During the etching of the trench a volatile Tantalum by-product such as tantalum oxide ($Ta_2O_2$) or tantalum fluoride ($TaF_3$) or a combination thereof is generated. The etchant gas mixture is described in further detail in the process block 154 described above.

The method then proceeds to process block 255 where the photoresist layer is removed. The removal of the photoresist is performed in a manner consistent with process blocks 163 and 167 described above. The typical gas chemistry for the removal of the photoresist does not include oxygen ($O_2$) or a halogen gas. One of the principal gases in the etchant mixture for photoresist removal includes a highly fluorinated fluorocarbon gas such as $CF_4$ or $CHF_3$. The highly fluorinated fluorocarbon gas is used to remove any residue or micromask that may have been deposited on the photoresist layer during the etching of the metal hard mask layer.

The method then proceeds to process block 256 where the intermediate hard mask layer are etched. The process 256 proceeds in a manner similar to the process 156 described above. The method then proceeds to perform the etching of the dielectric material. The boundary condition 258 defines the process steps for the etching of the dielectric layer. Within the boundary condition 258 is a decision diamond 260 that relates to the etching depth for the porous low-k dielectric layer. More particularly, the decision must be made whether to partially etch a trench into the porous low-k dielectric layer or whether to etch the trench through the porous low-k dielectric layer to the barrier layer.

If the decision at decision diamond 260 is made to etch the porous low-k dielectric layer all the way through to the barrier layer, then the method proceeds to process block 262. The process block 262 mirrors the process block 162, with the only exception being that the photoresist layer has already been removed. In the illustrative embodiment, the etching of the porous low-k dielectric is performed within the same chamber 100 as the etching of each hard mask layer and the etching of the photoresist layer.

If the decision is made to perform a partial etch in the dielectric layer, then the method proceeds to process block 266. As described in process block 166, the longer the illustrative IC structure is exposed to the etchant gas mixture the deeper the etch depth in the dielectric layer. During the partial etching of the dielectric layer, it is desirable to generate a smooth etch front within the dielectric layer.

Referring to FIG. 5A through FIG. 5G there is shown an isometric view of a trench being etched according to the method 250 described in FIG. 4. In the illustrative embodiment, the IC structure includes a photoresist layer 302, a first TaN hard mask layer 303 having a thickness of approximately 15 to 50 nm, a first intermediate hard mask layer 304 of SiN, a second intermediate hard mask layer 305 of SiC, a dielectric layer 306 having a thickness of approximately 200 to 1000 nm; and a barrier layer 308 having a thickness of around 45 to 70 nm.

Figure 5A:
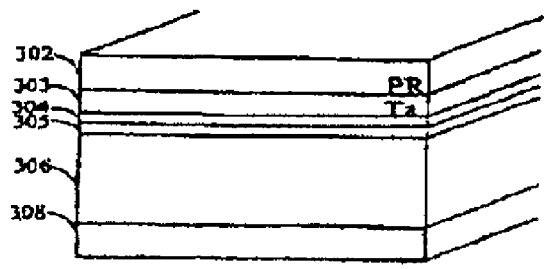
FIG. 5A through FIG. 5G shows an isometric view of a trench being etched according to the method of FIG. 4.
Figure 5B:
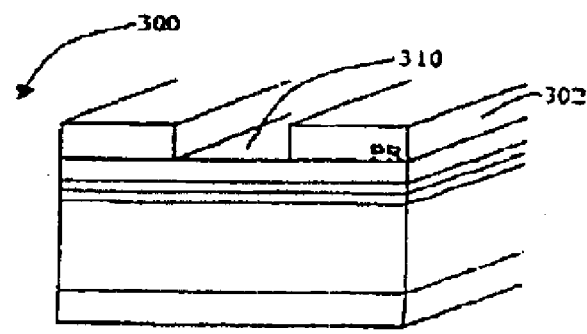
Figure 5C:
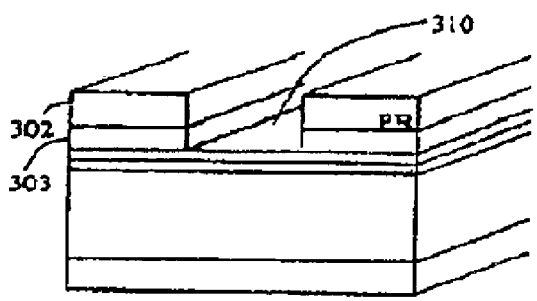

Referring to FIG. 5B, there is shown a trench 310 etched into the photoresist layer 302. The illustrative trench has a width of less than 0.12 $\mu$m for a CD of 0.10 $\mu$m, and a width of less than 0.09 $\mu$m for a CD of 0.07 $\mu$m. After the trench portion of the photoresist has been etched, the method proceeds to the etching of the TaN hard mask layer 303 as shown in FIG. 5C. As described in process block 254, during the etching of the TaN hard mask layer 303 a volatile metal by-product is generated. As previously described, the illustrative etchant gas mixture includes either oxygen ($O_2$) and a fluorocarbon gas and possibly a diluent gas such as Argon.

Figure 5D:
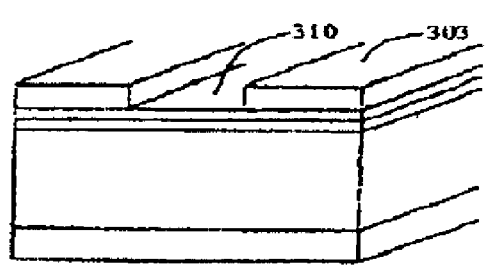

Referring to FIG. 5D, there is shown the photoresist layer being etched according to the process block 255 described above. The photoresist layer 302 is removed to reduce the aspect ratio before etching the porous low-k dielectric layer. When the first photoresist layer 302 is removed, the result is an IC having the patterned metal hard mask layer 303. After the photoresist 302 has been removed, the etched metal hard mask layer 303 provides the pattern for the etching the first intermediate hard mask layer 304 and the second intermediate hard mask layer 305.

Figure 5E:
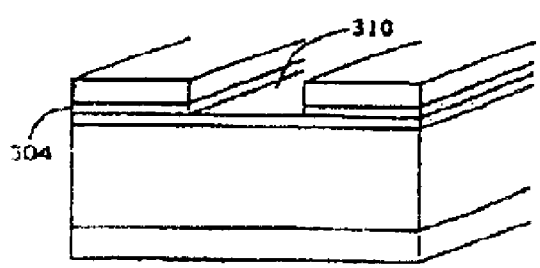
Figure 5F:
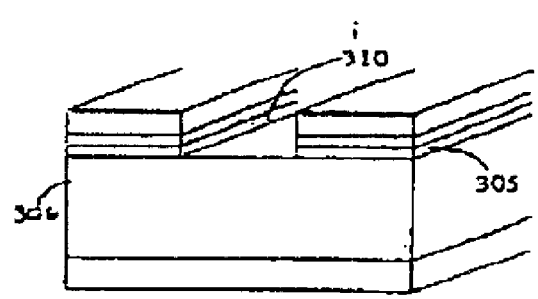
Figure 5G:
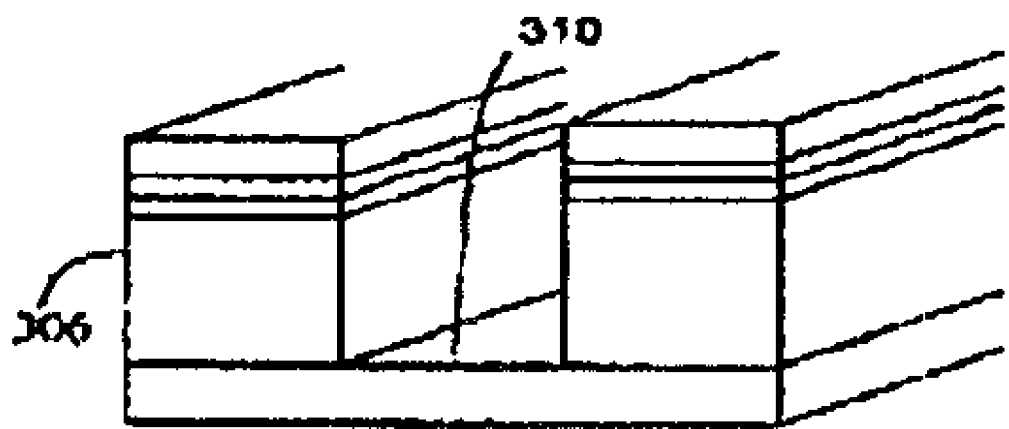

Referring to FIG. 5E there is shown an integrated circuit structure after etching the first intermediate hard mask layer 304. In the illustrative embodiment the first intermediate hard mask layer 304 is etched according to the process step 256. In FIG. 5F there is shown the illustrative integrated circuit structure after etching the second intermediate hard mask layer 305. Referring to FIG. 5G, there is shown the integrated circuit structure after the partial etching of the trench 310 into the dielectric layer 306. Alternatively, the trench 310 can be etched all the way through to the dielectric material 206 to the barrier layer 208 as shown in FIG. 5G.

Figure 6:
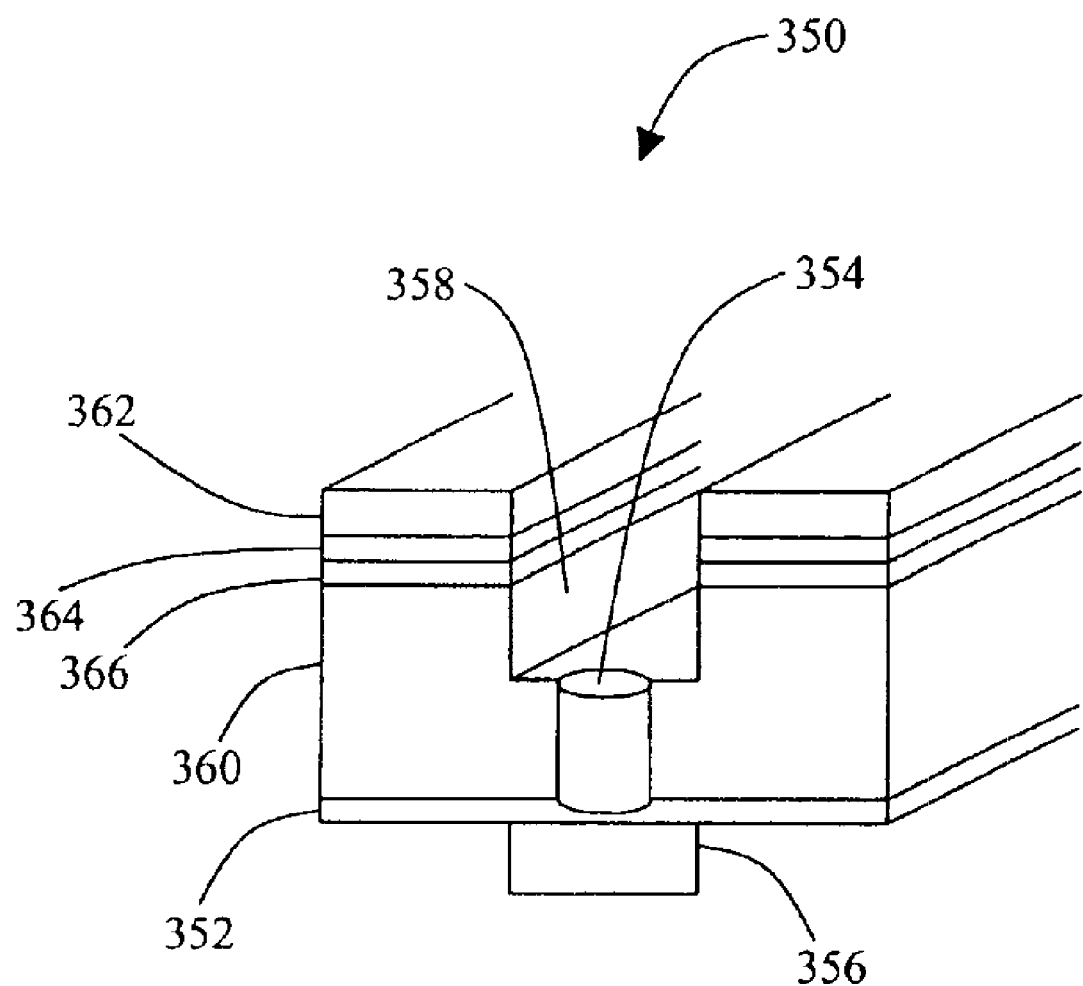
FIG. 6 is isometric view of an etched dual damascene structure.

Referring to FIG. 6 there is shown an etched dual damascene structure 350. The etched dual damascene structure was etched by conducting a via first etch to the barrier layer 352. Underneath thevia 354 is an electrically conductive element 356. The via first etch was conducted using the method described in FIG. 2 and FIG. 3 above. A trench 358 is then partially etched into the porous low-k dielectric layer 360 using the method described in FIG. 4 and FIG. 5 above. Although not shown, a photoresist is used to pattern the first metal hard mask layer 362. In one embodiment, the metal hard mask layer 362 comprises TaN and generates a volatile by-product which minimizes the formation of a micromask on the photoresist layer. The intermediate hard mask layers 364 and 366 perform the functions of providing adhesion between the porous low-k dielectric 360 and the metal hard mask layer 362.

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. A method of etching an integrated circuit (IC) structure said IC structure comprising a dielectric layer, an intermediate hard mask set including at least a first intermediate hard mask layer, said intermediate hard mask set being disposed above said dielectric layer, and a metal hard mask layer disposed above said set of intermediate hard masks, comprising:

etching said metal hard mask layer using a first plasma, said first plasma being formed from a first gas mixture that includes a fluorine containing gas and $O_2$;

etching said set of intermediate hard mask using a second plasma, said second plasma being formed from a second gas mixture that does not include said $O_2$; and etching said dielectric layer using a third plasma, said third plasma being formed from a third gas mixture that does not include said $O_2$.

2. The method of claim 1 wherein said etching said metal hard mask layer, said etching said set of intermediate hard mask, and said etching said dielectric layer are performed in a single plasma processing chamber.

3. The method of claim 1 wherein said metal hard mask layer comprises Tantalum Nitride.

4. The method of claim 1 wherein said metal hard mask layer comprises Tantalum.

5. The method of claim 1 wherein said fluorine containing gas comprises a $CF_4$ gas.

6. The method of claim 1 wherein said fluorine containing gas comprises a $CHF_3$ gas.

7. The method of claim 1 wherein said fluorine containing gas comprises a $NF_3$ gas.

8. The method of claim 1 wherein said fluorine containing gas comprises a fluorocarbon gas and a $NF_3$ gas.

9. A method for etching an integrated circuit (IC) structure, said IC structure comprising a dielectric layer, a first intermediate hard mask layer disposed above said dielectric layer, a second intermediate hard mask layer disposed above said first intermediate hard mask layer, and a metal hard mask layer disposed above said second intermediate hard mask layer, comprising:

etching said metal hard mask layer using a first plasma, said first plasma being formed from a first gas mixture that includes a fluorine containing gas and $O_2$;

etching said second intermediate hard mask layer using a second plasma, said second plasma being formed from a second gas mixture that includes said $O_2$;

etching said first intermediate hard mask layer using a third plasma, said third plasma being formed from a third gas mixture that does not include said $O_2$; and etching said dielectric layer using a fourth plasma, said fourth plasma being formed from a fourth gas mixture that does not include said $O_2$;

10. The method of claim 9 wherein said metal hard mask layer comprises Tantalum Nitride.

11. The method of claim 9 wherein said metal hard mask layer comprises Tantalum.

12. The method of claim 9 wherein said fluorine containing gas comprises a $CF_4$ gas.

13. The method of claim 9 wherein said fluorine containing gas comprises a $CHF_3$ gas.

14. The method of claim 9 wherein said fluorine containing gas comprises a $NF_3$ gas.

15. The method of claim 9 wherein said fluorine containing gas comprises a fluorocarbon gas and a $NF_3$ gas.

16. The method of claim 9 wherein said etching said dielectric layer ends when said etching said dielectric layer etches only partially through said dielectric layers.

17. The method of claim 9 wherein said etching said metal hard mask layer, said etching said first intermediate hard mask, said etching said second intermediate hard mask, and said etching said dielectric layer are performed in a single plasma processing chamber.

18. The method of claim 9 wherein said dielectric layer represents a low-k hybrid organic/inorganic silicate film.

19. The method of claim 18 wherein said dielectric layer has a porosity in which the void space is greater than 30%.

20. The method of claim 18 wherein said dielectric layer represent a porous organo-silica glass (pOSG) film.

21. The method of claim 9 wherein said second intermediate hard mask layer includes Silicon Nitride (SiN).

22. The method of claim 21 wherein said second gas mixture includes at least one of a $CF_4$ gas and a $CHF_3$ gas.

23. The method of claim 9 wherein said IC structure further includes a barrier layer disposed below said dielectric layer.

24. The method of claim 23 wherein said etching said dielectric layer etches through to said barrier layer.

25. The method of claim 9 wherein said first intermediate hard mask layer includes Silicon Carbide (SiC).

26. The method of claim 25 wherein said second intermediate hard mask layer includes Silicon Nitride (SiN).

27. The method of claim 25 wherein said third gas mixture includes nitrogen and at least one of a $CF_4$ gas and a $CHF_3$ gas.

28. The method of claim 27 wherein said third mixture further includes argon.

29. The method of claim 9 wherein said IC structure includes a photoresist layer for etching said dielectric layer.

30. The method of claim 29 further comprising:

removing said photoresist layer using a fifth plasma, said fifth plasma being formed from a fifth gas mixture that does not include said $O_2$.

31. The method of claim 30 wherein said fifth gas mixture includes at least one of a $CF_4$ gas and a $CHF_3$ gas.

32. The method of claim 31 wherein said fifth gas mixture includes $NF_3$.

* * * * *

UNITED STATES PATENT AND TRADEMARK OFFICE
CERTIFICATE OF CORRECTION

PATENT NO. : 6,930,048 B1
DATED : August 16, 2005
INVENTOR(S) : Li et al.

It is certified that error appears in the above-identified patent and that said Letters Patent is hereby corrected as shown below:

<u>Title page,</u>
Item [75], Inventors, please change "S.M. Rega Sadjadi" to -- S.M. Reza Sadjadi --.

Signed and Sealed this

Twenty-second Day of November, 2005

JON W. DUDAS
*Director of the United States Patent and Trademark Office*